(12) United States Patent
Shooshtari et al.

(10) Patent No.: US 8,148,277 B2
(45) Date of Patent: *Apr. 3, 2012

(54) PROCESS FOR BINDING FIBROUS MATERIALS UTILIZING A POLYANHYDRIDE AND RESULTING PRODUCT

(75) Inventors: Kiarash Alavi Shooshtari, Littleton, CO (US); Jawed Asrar, Greenwood Village, CO (US)

(73) Assignee: Johns Manville, Denver, CO (US)

( * ) Notice: Subject to any disclaimer, the term of this patent is extended or adjusted under 35 U.S.C. 154(b) by 1115 days.

This patent is subject to a terminal disclaimer.

(21) Appl. No.: 12/008,907

(22) Filed: Jan. 15, 2008

(65) Prior Publication Data

US 2009/0181251 A1    Jul. 16, 2009

(51) Int. Cl.
*B32B 17/02* (2006.01)
*D02G 3/00* (2006.01)

(52) U.S. Cl. .................. 442/180; 428/375; 427/385.5; 427/389.7

(58) Field of Classification Search .............. 442/180; 428/299.4, 375
See application file for complete search history.

(56) References Cited

U.S. PATENT DOCUMENTS

| | | | |
|---|---|---|---|
| 5,143,582 A | 9/1992 | Arkens et al. | |
| 5,318,990 A | 6/1994 | Strauss | |
| 5,340,868 A | 8/1994 | Strauss et al. | |
| 5,427,587 A | 6/1995 | Arkens et al. | |
| 5,661,213 A | 8/1997 | Arkens et al. | |
| 6,136,916 A | 10/2000 | Arkens et al. | |
| 6,221,973 B1 | 4/2001 | Arkens et al. | |
| 6,331,350 B1 | 12/2001 | Taylor et al. | |
| 6,706,853 B1 | 3/2004 | Stanssens et al. | |
| 2008/0274292 A1* | 11/2008 | Shooshtari et al. | 427/389.8 |
| 2009/0181252 A1* | 7/2009 | Shooshtari et al. | 428/375 |

FOREIGN PATENT DOCUMENTS

EP    0 583 086 A1    2/1994

OTHER PUBLICATIONS

Formaldehyde-Free Crosslinking Binders for Nonwovens, Charles T. Arkens et al., TAPPI Journal, vol. 78, No. 11, pp. 161-168, Nov. 1995.

* cited by examiner

*Primary Examiner* — Lynda Salvatore
(74) *Attorney, Agent, or Firm* — Robert D. Touslee

(57) ABSTRACT

A process for securely binding the adjoining fibers of a fibrous material in the absence of the use of a phenol-formaldehyde reaction product is provided. A curable binding composition comprising a water-soluble intermediate reaction product having hydroxyl and carboxylic acid end groups that is capable of undergoing an esterification crosslinking reaction is provided. The intermediate reaction product is formed by the reaction of (i) a polyanhydride, and (ii) certain polyol crosslinkers other than an alkanolamine. Such crosslinkers have been found to yield a bound product that displays improved color (i.e., lighter color). Particularly preferred crosslinkers are triethylene glycol and tripropylene glycol. When applied to a fibrous material, the intermediate reaction product is reacted with crosslinking to form a cured reaction product. In a preferred embodiment the securely bound fibrous product is building insulation of good color that well resists water.

20 Claims, No Drawings

PROCESS FOR BINDING FIBROUS MATERIALS UTILIZING A POLYANHYDRIDE AND RESULTING PRODUCT

BACKGROUND OF THE INVENTION

1. Field of the Invention

The subject invention pertains to an improved binding composition for use with fibrous materials. More specifically, the subject invention pertains to the use of a curable binding composition comprising an intermediate reaction product derived from a polyanhydride. The intermediate reaction product is formed in the presence of an appropriate crosslinker (as defined) which preferably is triethylene glycol or tripropylene glycol. When applied to a fibrous material, the binding composition comprising the intermediate reaction product while present as a coating on the fibrous material is heated and the hydroxyl and carboxylic acid end groups present therein undergo crosslinking via an esterification reaction to form a cured binder for the fibrous material.

2. Description of the Related Art

Binders for fibrous materials, such as fiberglass, have a variety of uses ranging from stiffening applications where the binder is applied to woven or non-woven fiberglass sheet goods and is cured, producing a stiffer product; thermo-forming applications wherein the binder resin is applied to a sheet or lofty fibrous product, following which it is dried and optionally is B-staged to form an intermediate but yet curable product; and to fully cured systems such as building insulation.

Fibrous glass insulation products generally comprise matted glass fibers bonded together by a cured thermoset polymeric material. Molten streams of glass are drawn into fibers of random lengths and are blown into a forming chamber where they are randomly deposited as a mat onto a traveling conveyor. The fibers, while in transit in the forming chamber and while still hot from the drawing operation, are sprayed with an aqueous binder. A phenol-formaldehyde binder has been used throughout the fibrous glass insulation industry. The residual heat from the glass fibers and the flow of air through the fibrous mat during the forming operation are generally sufficient to volatilize water from the binder, thereby leaving the remaining components of the binder on the fibers as a viscous or semi-viscous high solids liquid. The coated fibrous mat is transferred to a curing oven where heated air, for example, is blown through the mat to cure the binder and rigidly bond the glass fibers together.

Fiberglass binders used in the present sense should not be confused with matrix resins which are an entirely different and non-analogous field of art. While sometimes termed "binders", matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins are not suitable for use as fiberglass binders. One skilled in the art of fiberglass binders would not look to cellulosic binders to solve any of the known problems associated with fiberglass binders or binders for use on similar fibrous materials.

Binders useful in fiberglass insulation products generally require a low viscosity in the uncured state, yet possess characteristics so as to form a rigid thermoset polymeric mat for the glass fibers when cured. A low binder viscosity in the uncured state is required to allow the mat to be sized correctly. Also, viscous binders tend to be tacky or sticky and hence they lead to the unwanted accumulation of fiber on the forming chamber walls. This accumulated fiber may later fall onto the mat causing dense areas and product problems. A binder which forms a rigid matrix when cured is required so that a finished fiberglass thermal insulation product or similar product, when compressed for packaging and shipping, will recover to its as-made vertical dimension when installed in a building.

From among the many thermosetting polymers, numerous candidates for suitable thermosetting fiberglass binder resins exist. However, binder-coated fiberglass products are often of the commodity type, and thus cost becomes a driving factor, generally ruling out such resins as thermosetting polyurethanes, epoxies, and others. Due to their excellent cost/performance ratio, the resins of choice in the past have been phenol-formaldehyde resins. Phenol-formaldehyde resins can be economically produced, and can be extended with urea prior to use as a binder in many applications. Such urea-extended phenol-formaldehyde binders have been the mainstay of the fiberglass insulation industry for years, for example.

Over the past several decades however, minimization of volatile organic compound emissions (VOCs) both on the part of the industry desiring to provide a cleaner environment, as well as by Federal regulation, has led to extensive investigations into not only reducing emissions from the current formaldehyde-based binders, but also into candidate replacement binders. For example, subtle changes in the ratios of phenol to formaldehyde in the preparation of the basic phenol-formaldehyde resole resins, changes in catalysts, and addition of different and multiple formaldehyde scavengers, has resulted in considerable improvement in emissions from phenol-formaldehyde binders as compared with the binders previously used. However, with increasingly stringent Federal regulations, more and more attention has been paid to alternative binder systems which lack formaldehyde.

One such candidate binder system employs polymers of acrylic acid as a first component, and a polyol such as glycerine or a modestly oxyalkylated glycerine as a curing or "crosslinking" component. The preparation and properties of such poly(acrylic acid)-based binders, including information relative to the VOC emissions, and a comparison of binder properties versus urea formaldehyde binders is presented in "Formaldehyde-Free Crosslinking Binders For Non-Wovens", Charles T. Arkins et al., TAPPI JOURNAL, Vol. 78, No. 11, pages 161-168, November 1995. The binders disclosed by the Arkins article, appear to be B-stageable as well as being able to provide physical properties similar to those of urea-formaldehyde resins.

U.S. Pat. No. 5,340,868 discloses fiberglass insulation products cured with a combination of a polycarboxy polymer, a beta-hydroxyalkylamide, and at least one trifunctional monomeric carboxylic acid such as citric acid. The specific polycarboxy polymers disclosed are poly(acrylic acid) polymers. See also, U.S. Pat. No. 5,143,582

U.S. Pat. No. 5,318,990 discloses a fibrous glass binder which comprises a polycarboxy polymer, a monomeric trihydric alcohol and a catalyst comprising an alkali metal salt of a phosphorous-containing organic acid.

Published European Patent Application EP 0 583 086 A1 appears to provide details of polyacrylic acid binders whose cure is catalyzed by a phosphorus-containing catalyst system as discussed in the Arkins article previously cited. Higher molecular weight poly(acrylic acids) are stated to provide polymers exhibiting a more complete cure. See also U.S. Pat. Nos. 5,661,213; 5,427,587; 6,136,916; and 6,221,973.

Some polycarboxy polymers have been found useful for making fiberglass insulation products. Problems of clumping or sticking of the glass fibers to the inside of the forming chambers during the processing, as well as providing a final product that exhibits the recovery and rigidity necessary to provide a commercially acceptable fiberglass insulation product, have been overcome. See, for example, U.S. Pat. No. 6,331,350. The thermosetting acrylic resins have been found to be more hydrophilic than the traditional phenolic binders, however. This hydrophilicity can result in fiberglass insulation that is more prone to absorb water, thereby possibly compromising the integrity of the product. Also, the thermosetting acrylic resins now being used as binding agents for fiberglass have been found to not react as effectively with silane coupling agents of the type traditionally used by the industry. The addition of silicone as a hydrophobing agent results in problems when abatement devices are used that are based on incineration. Also, the presence of silicone in the manufacturing process can interfere with the adhesion of certain facing substrates to the finished fiberglass material. Overcoming these problems will help to better utilize polycarboxy polymers in fiberglass binders.

U.S. Pat. No. 6,706,853 discloses a reaction product of a cyclic anhydride and an alkanolamine for use when binding fiberglass. Representative cyclic anhydrides include anhydride polymers of maleic anhydride with styrene and with methacrylate monomers.

It is an objective of the present invention to provide a novel process to well bind fibrous materials and the resulting bound product which displays good color in the absence of the use of a phenol-formaldehyde binder.

Other objects and advantages of the invention will be apparent to those skilled in the art upon a review of the following description and appended claims.

SUMMARY OF THE INVENTION

A process for binding a fibrous material is provided comprising:

(a) forming a water-soluble curable intermediate reaction product having hydroxyl and carboxylic acid end groups by the reaction of (i) a polyanhydride, and (ii) a crosslinker selected from the group consisting of glycols, glycol ethers, polyester polyols, polyether polyols, epoxy polyols, urethane polyols, polysaccharides, polyvinyl alcohol, polypeptides, and mixtures thereof, (b) applying a composition comprising said intermediate reaction product as a coating to a fibrous material, and (c) heating the coated fibrous material to achieve crosslinking of the hydroxyl and carboxylic acid end groups via an esterification reaction while in association with the fibrous material to form a cured binder on the fibrous material.

A stable quality bound fibrous material is formed which displays good color and good resistance to water.

In a particularly preferred embodiment the resulting fibrous material is fiberglass building insulation. In other preferred embodiments the fibrous product is a microglass-based substrate useful for fiberglass printed circuit board, battery separator, filter stock or reinforcement scrim.

DETAILED DESCRIPTION OF PREFERRED EMBODIMENTS

Initially a water-soluble curable intermediate reaction product having hydroxyl and carboxylic acid end groups is formed through the reaction of a polyanhydride and certain polyol crosslinkers other than an alkanolamine which have been found to yield a bound glass product of improved (i.e., lighter) color.

The polyanhydride displays a plurality of anhydride functional groups and is of a relatively high average molecular weight of greater than 1,000 up to approximately 100,000. In a preferred embodiment the average molecular weight of the polyanhydride is approximately 2,000 to 5,000.

Representative polyanhydrides suitable for use when carrying out the present invention include polyacrylic anhydride, polymethacrylic anhydride, poly(acrylic-co-methacrylic)anhydride, poly(acrylic-co-maleic)anhydride, poly(methacrylic-co-maleic)anhydride, polycrotonic anhydride, polymaleic anhydride, poly(styrene-maleic)anhydride, poly(ethylene-maleic)anhydride, poly(propylene-maleic)anhydride, poly(vinylether-maleic anhydride, and mixtures of the foregoing. The polyanhydride optionally can possess a block structure. When the polyanhydride includes a substantial concentration of water-insoluble blocks such as styrene or ethylene, the resulting intermediate reaction product commonly will be water-dispersible rather than water-soluble. In preferred embodiments the intermediate reaction product is water-soluble. Preferred polyanhydrides for use when practicing the present invention are polyacrylic anhydride, polymethacrylic anhydride, and poly(styrene-maleic)anhydride possessing the appropriate molecular weight. The particularly preferred polyanhydride for use when practicing the invention is poly(styrene-maleic)anhydride.

The crosslinker for use when forming the intermediate reaction product is selected from the group consisting of glycols, glycol ethers, polyester polyols, polyether polyols, epoxy polyols, urethane polyols, polysaccharides, polyvinyl alcohol, polypeptides, and mixtures of these. Preferred crosslinkers for use when forming the intermediate reaction product are triethylene glycol, tripropylene glycol, and mixtures of these.

The initial crosslinking reaction commonly is carried out with stirring at a temperature of approximately 50 to 100° C. Reaction times of 10 minutes to 10 hours, and preferably more than 1 hour commonly are utilized. The resulting crosslinked intermediate reaction product possesses hydroxyl and carboxylic acid end groups. Fourier Transform Infrared Spectroscopy (FTIR) can be utilized to characterize such end groups.

During the formation of the intermediate reaction product a minor concentration of an alkanolamine optionally may be present. Such alkanolamines include alkyl alkanolamines, dialkyl alkanolamines, mono-, di-, tri-, and poly-alkanolamines. Preferred alkanolamines for inclusion in a minor concentration are diethanolamine, triethanolamine, and mixtures of these. Such alkanolamines when utilized are included in a concentration up to 10 mole percent (e.g., 1 to 10 mole percent) of that of the crosslinker and serve primarily a catalytic and stabilizing role in the presence of water during the formation of the intermediate reaction product. Accordingly, the formation of the intermediate reaction product is expedited somewhat in the presence of a minor concentration of such alkanolamine.

Alternatively a catalytic quantity of a tertiary amine can be included to serve as a catalyst during the formation of the intermediate reaction product. A preferred tertiary amine to serve in this role is 2-methylimidazole. Other possible tertiary amines include triethylamine, tripropylamine, tributylamine, etc.

It additionally is possible during the formation of the intermediate reaction product that a base be present which is capable of forming a salt with a carboxylic acid end groups derived from the polyanhydride. When such salt is formed, the resulting intermediate reaction product will display a lower viscosity and the intimate coating of the fibrous material between adjoining fibers is aided. Representative bases for use during salt formation include sodium hydroxide, ammonium hydroxide, etc.

The size composition comprising the intermediate reaction product optionally may include further polymeric emulsion components, adhesion promoters, oxygen scavengers, solvents, emulsifiers, pigments, anti-migration aids, UV absorbers, biocides, anti-foaming agents, colorants, dyes, anti-static agents, antioxidants, etc.

The fibrous material to which the curable intermediate reaction product is applied can be provided in various configurations. The fibrous components of the fibrous material can be continuous or discontinuous. For instance, the fibers can be mineral fibers or polymeric fibers that possess sufficient thermal stability to withstand the curing of the coated fibrous material when heated as described hereafter. Representative polymeric fibers include polyethylene terephthalate fibers which are provided in the form of a spun-bonded mat. In a preferred embodiment the fibrous material comprises glass fibers, and preferably fiberglass fibers that are supplied as long multifilamentary rovings or tows of infinite length. The filament diameters can be adjusted to meet the needs of the requirements of specific end uses. In a preferred embodiment, the fibrous material is fiberglass for the production of building insulation. In other embodiments the fibrous product is a microglass-based substrate useful for a fiberglass printed circuit board, battery separator, filter stock or reinforcement scrim.

The binder composition containing the intermediate reaction product can be applied to the fibrous material as a coating by any technique capable of coating the individual fibrous components thereof. For instance, when the fibrous material is provided in a continuous length, a kiss-roll applicator can be utilized.

During the curing step of the process the coated fibrous material commonly is heated at a temperature of approximately 100 to 300° C. to achieve crosslinking via an esterification reaction. Representative curing times are approximately 1 to 40 minutes (e.g., approximately 10 to 30 minutes). If the fibrous material is a thermoplastic fibrous material, it is essential that the curing temperature that is selected not exceed the deformation or melting temperature of such fibrous material.

At the conclusion of the crosslinking reaction the binder commonly is securely bound on the surfaces of the fibrous material in a concentration of approximately 1 to 25 (e.g., 5 to 6) percent by weight of the fibrous material.

The following Examples are presented to provide specific representative embodiments of the present invention. It should be understood, however, that the invention is not limited to specific details set forth in the Examples.

EXAMPLE 1

In a reaction zone were provided 100 grams of water, 24 grams of a polyanhydride in the form of poly(styrene-maleic) anhydride, and 15 grams of triethylene glycol crosslinker. The poly(styrene-maleic)anhydride possessed an average molecular weight of approximately 2,000. The contents of the reaction zone were heated with stirring for 6 hours under refluxing conditions at 100° C. to form a water-soluble intermediate reaction product having hydroxyl and carboxylic acid end groups. The resulting clear homogenous solution of the intermediate reaction product was next coated on a multifilamentary glass roving, and the coated roving was heated in an air atmosphere at 200° C. to achieve the crosslinking of the hydroxyl and carboxylic acid end groups of the intermediate reaction product via an esterification reaction while in association with glass roving to form a cured binder thereon. The adjoining filaments were bound at cross-over points. The resulting cured binder was highly resistant to water, displayed an attractive light coloration and satisfactory toughness and hardness when evaluated by dynamic mechanical analysis.

EXAMPLE 2

Example 1 was repeated with the exception that 0.4 of sodium hydroxide was initially present in the reaction zone with the water, the polyanhydride, and triethylene glycol crosslinker. Such sodium hydroxide formed a salt with carboxylic acid end groups derived from the poly(styrene-maleic)anhydride and served to aid in the formation of a solution of the intermediate reaction product wherein the viscosity was reduced. Such reduced viscosity served to enhance the penetration of the glass roving when coated and to aid in the intimate coating of filaments thereof. The formation of a quality product with superior binder penetration was achieved.

EXAMPLE 3

In a stirred reaction zone were provided 100 grams of water, 24 grams of poly(styrene-maleic)anhydride having an average molecular weight of approximately 2,000, 19.2 grams of tripropylene glycol crosslinker, and 0.5 gram of a tertiary amine in the form of 2-methyl imidazole which served as a catalyst. The contents of the reaction zone were heated with stirring for 4 hours under refluxing conditions at 100° C. to form a water-soluble intermediate reaction product having hydroxyl and carboxylic acid end groups. The presence of the 2-methyl imidazole in the reaction zone in a relatively small concentration served primarily as a catalyst for the cross-linking via an esterification reaction and served to expedite the formation of the intermediate reaction product. The resulting clear homogenous solution of the intermediate reaction product was coated on a multifilamentary glass roving and was cured as described in Example 1 to form a substantially similar attractive product wherein adjoining filaments were bound at cross-over points.

EXAMPLE 4

In a stirred reaction zone were provided 100 grams of water, 26.4 grams of poly(styrene-maleic)anhydride having an average molecular weight of approximately 2,000, 15 grams of triethylene glycol crosslinker, and 1.05 grams of diethanolamine. The contents of the reaction zone were heated with stirring for 6 hours under refluxing conditions at 100° C. to form a water-soluble intermediate reaction product having hydroxy and carboxylic acid end groups. The presence of the diethanolamine in a relatively small concentration served primarily to catalyze the crosslinking reaction wherein the intermediate reaction was formed. The resulting clear homogenous solution of the intermediate reaction product was coated on a multifilamentary glass roving and was cured as described in Example 1 to form a substantially similar attractive product wherein adjoining filaments were bound at cross-over points.

EXAMPLE 5

Example 4 was repeated wherein 13.4 grams of tripropylene glycol crosslinker were substituted for the triethylene glycol crosslinker. Substantially similar results were achieved.

The principles, preferred embodiments, and modes of operation of the present invention have been described in the foregoing specification. The invention which is protected herein, however, is not to be construed as being limited to the particular forms disclosed, since these are to be regarded as being illustrative rather than restrictive. Variations and changes may be made by those skilled in the art without departing from the spirit of the invention.

We claim:

1. A process for binding a fibrous material comprising:
   (a) forming a water-soluble curable intermediate reaction product having hydroxyl and carboxylic acid end groups by the reaction of (i) a polyanhydride having an average molecular weight in the range of from greater than 1,000 to approximately 100,000, and (ii) a crosslinker selected from the group consisting of glycols, glycol ethers, polyester polyols, polyether polyols, epoxy polyols, urethane polyols, polysaccharides, polyvinyl alcohol, polypeptides, and mixtures thereof,
   (b) applying a composition comprising said intermediate reaction product as a coating to a fibrous material, and
   (c) heating said coated fibrous material to achieve crosslinking of said hydroxyl and carboxylic acid end groups via an esterification reaction while in association with the fibrous material to form a cured binder on said fibrous material.

2. The process of claim 1, wherein said fibrous material comprises mineral fibers.

3. The process of claim 1, wherein said fibrous material comprises glass fibers.

4. The process of claim 1, wherein said polyanhydride of step (a) has an average molecular weight of approximately 2,000 to 5,000.

5. The process of claim 1, wherein said polyanhydride of step (a) is selected from the group consisting of polyacrylic anhydride, polymethacrylic anhydride, poly(acrylic-co-methacrylic)anhydride, poly(acrylic-co-maleic)anhydride, poly(methacrylic-co-maleic)anhydride, polycrotonic anhydride, polymaleic anhydride, poly(styrene-maleic)anhydride, poly(ethylene-maleic)anhydride, poly(propylene-maleic)anhydride, poly(vinylether-maleic)anhydride, and mixtures of the forgoing.

6. The process of claim 1, wherein said polyanhydride of step (a) is poly(styrene-maleic)anhydride.

7. The process of claim 1, wherein said polyanhydride of step (a) is polyacrylic anhydride.

8. The process of claim 1, wherein said polyanhydride of step (a) is polymethacrylic anhydride.

9. The process of claim 1, wherein said crosslinker of step (a) is selected from the group consisting of triethylene glycol, tripropylene glycol, and mixtures thereof.

10. The process according to claim 1, wherein said polyanhydride of step (a) poly(styrene-maleic)anhydride having a molecular weight of approximately 2,000 to 5,000, and said crosslinker of step (a) is selected from the group consisting of triethylene glycol, tripropylene glycol, and mixtures thereof.

11. The process according to claim 1, wherein said step (a) is carried out a temperature of approximately 50 to 100° C.

12. The process of claim 1, wherein in step (a) a base capable of forming a salt with carboxylic acid groups derived from the polyanhydride is included whereby a salt is formed and the viscosity of the intermediate reaction product is lowered.

13. The process according to claim 1, wherein in step (a) up to 10 mole percent of an alkanolamine is included based on the quantity of the crosslinker (ii).

14. The process according to claim 13, wherein said alkanolamine is selected from the group consisting of diethanolamine, triethanolamine, and mixtures of the foregoing.

15. The process of claim 1, wherein in step (a) up to 10 mole percent of a tertiary amine is included based on the concentration of the crosslinker (ii).

16. The process of claim 1, wherein in step (c) said heating is carried out at a temperature of approximately 100 to 300° C. to produce a cured binder in association with the fibrous material wherein adjoining fibers are bound together at crossover points.

17. A fibrous material that is coated with a water-resistant cured binder produced in accordance with the process of claim 1 wherein adjoining fibers are bound at cross-over points.

18. A fiberglass product that is coated with a water-resistant cured binder produced in accordance with the process of claim 1 wherein adjoining fibers are bound at cross-over points.

19. A fiberglass building insulation product that is coated with a water-resistant cured binder produced in accordance with the process of claim 1 wherein adjoining fibers are bound at cross-over points.

20. A process for binding a fibrous material comprising:
   (a) forming a water-soluble curable intermediate reaction product having hydroxyl and carboxylic acid end groups by the reaction of (i) a polyanhydride, and (ii) a crosslinker selected from the group consisting of glycols, glycol ethers, polyester polyols, polyether polyols, epoxy polyols, urethane polyols, polysaccharides, polyvinyl alcohol, polypeptides, and mixtures thereof,
   (b) applying a composition comprising said intermediate reaction product as a coating to a fibrous material, and
   (c) heating said coated fibrous material to achieve crosslinking of said hydroxyl and carboxylic acid end groups via an esterification reaction while in association with the fibrous material to form a cured binder on said fibrous material, wherein said polyanhydride of step (a) is selected from the group consisting of polyacrylic anhydride, polymethacrylic anhydride, poly(acrylic-co-methacrylic)anhydride, poly(acrylic-co-maleic)anhydride, poly(methacrylic-co-maleic)anhydride, polycrotonic anhydride, polymaleic anhydride, poly(styrene-maleic)anhydride, poly(ethylene-maleic)anhydride, poly(propylene-maleic)anhydride, poly(vinylether-maleic)anhydride, and mixtures of the foregoing.

* * * * *